United States Patent
Kudoh (10) Patent No.: US 10,600,828 B2
(45) Date of Patent: Mar. 24, 2020

(54) SOLID-STATE IMAGING ELEMENT, SENSOR APPARATUS, AND ELECTRONIC DEVICE

(71) Applicant: SONY CORPORATION, Tokyo (JP)

(72) Inventor: Yoshiharu Kudoh, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/086,697

(22) PCT Filed: Mar. 17, 2017

(86) PCT No.: PCT/JP2017/010865
§ 371 (c)(1),
(2) Date: Sep. 20, 2018

(87) PCT Pub. No.: WO2017/169884
PCT Pub. Date: Oct. 5, 2017

(65) Prior Publication Data
US 2019/0123079 A1    Apr. 25, 2019

(30) Foreign Application Priority Data

Mar. 31, 2016  (JP) ................................ 2016-072167

(51) Int. Cl.
*H01L 27/146* (2006.01)
*H01L 29/423* (2006.01)
(Continued)

(52) U.S. Cl.
CPC .... *H01L 27/14616* (2013.01); *H01L 27/1463* (2013.01); *H01L 27/14614* (2013.01);
(Continued)

(58) Field of Classification Search
CPC ......... H01L 27/14614; H01L 27/14616; H01L 27/1463; H01L 29/42356; H01L 29/4236;
(Continued)

(56) References Cited

U.S. PATENT DOCUMENTS 10,199,423 B2 *  2/2019  Ihara ................... H01L 27/1461
2006/0084195 A1   4/2006  Lyu
(Continued)

FOREIGN PATENT DOCUMENTS

JP    2006-121093    5/2006
JP    2010-003916    1/2010
(Continued)

OTHER PUBLICATIONS

International Search Report prepared by the Japan Patent Office on May 18, 2017, for International Application No. PCT/JP2017/010865.

*Primary Examiner* — Stephen W Smoot
(74) *Attorney, Agent, or Firm* — Sheridan Ross P.C.

(57) ABSTRACT

The present disclosure relates to a solid-state imaging element, a sensor apparatus, and an electronic device capable of achieving better characteristics. A transistor constituting a pixel includes: a gate electrode having at least two fin portions formed so as to be buried from a planar portion planarly formed on a surface of a semiconductor substrate toward an inside of the semiconductor substrate; and a channel portion provided across a source and a drain so as to be in contact with side surfaces of the fin portions via an insulating film. In addition, a width of the channel portion is formed to be narrower than a depth of the fin portion. The present technology is applicable to a CMOS image sensor, for example.

20 Claims, 10 Drawing Sheets

(51) Int. Cl.
 *H01L 29/78* (2006.01)
 *H04N 5/374* (2011.01)
 *H04N 5/378* (2011.01)

(52) U.S. Cl.
 CPC .... *H01L 27/14643* (2013.01); *H01L 29/4236* (2013.01); *H01L 29/42376* (2013.01); *H01L 29/785* (2013.01); *H04N 5/374* (2013.01); *H04N 5/378* (2013.01)

(58) Field of Classification Search
 CPC ............ H01L 29/42376; H01L 29/785; H01L 29/7851; H01L 2029/7857
 See application file for complete search history.

(56) References Cited

U.S. PATENT DOCUMENTS

| | | |
|---|---|---|
| 2008/0153193 A1 | 6/2008 | Lyu |
| 2009/0315092 A1 | 12/2009 | Mikasa et al. |
| 2013/0076934 A1 | 3/2013 | Maeda et al. |
| 2013/0140442 A1 | 6/2013 | Yanagita et al. |
| 2013/0291627 A1* | 11/2013 | Hu ..................... G01N 27/4146 73/61.61 |
| 2014/0252420 A1 | 9/2014 | Yi et al. |
| 2014/0327059 A1 | 11/2014 | Ammo |
| 2015/0069471 A1 | 3/2015 | Kawamura |
| 2015/0206973 A1 | 7/2015 | Oyu |
| 2015/0357363 A1 | 12/2015 | Kawamura |
| 2016/0020237 A1 | 1/2016 | Yamakawa |
| 2016/0248998 A1 | 8/2016 | Ammo |
| 2018/0151414 A1* | 5/2018 | Wu .................. H01L 21/76229 |

FOREIGN PATENT DOCUMENTS

| | | |
|---|---|---|
| JP | 2012-044004 | 3/2012 |
| JP | 2013-021077 | 1/2013 |
| JP | 2013-069846 | 4/2013 |
| JP | 2013-125862 | 6/2013 |
| JP | 2015-053411 | 3/2015 |
| WO | WO 2013/094430 | 6/2013 |
| WO | WO 2014/027691 | 2/2014 |
| WO | WO 2014/141900 | 9/2014 |

* cited by examiner

SOLID-STATE IMAGING ELEMENT, SENSOR APPARATUS, AND ELECTRONIC DEVICE

CROSS REFERENCE TO RELATED APPLICATIONS

This application is a national stage application under 35 U.S.C. 371 and claims the benefit of PCT Application No. PCT/JP2017/010865 having an international filing date of 17 Mar. 2017, which designated the United States, which PCT application claimed the benefit of Japanese Patent Application No. 2016-072167 filed 31 Mar. 2016, the entire disclosures of each of which are incorporated herein by reference.

TECHNICAL FIELD

The present disclosure relates to a solid-state imaging element, a sensor apparatus, and an electronic device, and particularly relates to a solid-state imaging element, a sensor apparatus, and an electronic device capable of achieving better characteristics.

BACKGROUND ART

In a known electronic device having an imaging function, such as a digital still camera and a digital video camera, a solid-state imaging element such as a charge coupled device (CCD) and a complementary metal oxide semiconductor (CMOS) image sensor is employed, for example. The solid-state imaging element includes a pixel combining a photo-diode (PD) that performs photoelectric conversion and a plurality of transistors. An image is constructed on the basis of a pixel signal output from a plurality of the pixels arranged on an image plane on which an image of a subject is formed.

Furthermore, in order to accommodate the pixels in a pixel region with limited area, it is necessary to form the pixel with as few transistors as possible, and a source follower amplifier is adopted as an amplification transistor in typical cases. Since the source follower amplifier can arrange a constant current source outside the pixel region, it is possible to reduce the area of the pixel region, and possible to drive a large capacitive load by amplifying the current. On the other hand, since the source follower amplifier has a voltage amplification factor of 1 or less, it is disadvantageous compared with a voltage amplification type amplifier in terms of a signal/noise (SN) ratio against noise in a subsequent circuit.

Accordingly, in order to suppress the occurrence of noise, the applicant of the present invention has proposed a solid-state imaging element having a portion of a gate electrode constituting an amplification transistor with a protrusion buried in a substrate on which a PD is formed (for example, refer to Patent Document 1).

CITATION LIST

Patent Document

Patent Document 1: Japanese Patent Application Laid-Open No. 2013-125862

SUMMARY OF THE INVENTION

Problems to be Solved by the Invention

Meanwhile, while a channel width can be increased in the solid-state imaging element disclosed in Patent Document 1, a modulation depth enhancement effect is low, for example. Then, it is required to enhance the modulation depth to achieve better characteristics.

The present disclosure is made in view of such a situation and aims to achieve better characteristics.

Solutions to Problems

A solid-state imaging element according to one aspect of present disclosure includes a pixel having a transistor including: a gate electrode having at least one fin portion formed so as to be buried from a planar portion planarly formed on a surface of a semiconductor substrate toward an inside of the semiconductor substrate; and a channel portion provided across a source and a drain so as to be in contact with a side surface of the fin portion via an insulating film, the transistor being formed to have a width of the channel portion narrower than a depth of the fin portion.

A sensor apparatus according to one aspect of the present disclosure includes a sensor portion having a transistor including: a gate electrode having at least one fin portion formed so as to be buried from a planar portion planarly formed on a surface of a semiconductor substrate toward an inside of the semiconductor substrate; and a channel portion provided across a source and a drain so as to be in contact with a side surface of the fin portion via an insulating film, the transistor being formed to have a width of the channel portion narrower than a depth of the fin portion.

An electronic device according to one aspect of present disclosure includes a solid-state imaging element having a pixel including a transistor including: a gate electrode having at least one fin portion formed so as to be buried from a planar portion planarly formed on a surface of a semiconductor substrate toward an inside of the semiconductor substrate; and a channel portion provided across a source and a drain so as to be in contact with a side surface of the fin portion via an insulating film, the transistor being formed to have a width of the channel portion narrower than a depth of the fin portion.

One aspect of the present disclosure includes a transistor in which a gate electrode includes at least one fin portion formed so as to be buried from a planar portion planarly formed on a surface of a semiconductor substrate toward an inside of the semiconductor substrate, and a channel portion is provided across a source and a drain so as to be in contact with a side surface of the fin portion via an insulating film. In addition, a width of the channel portion is formed to be narrower than a depth of the fin portion.

Effects of the Invention

According to one aspect of present disclosure, it is possible to achieve better characteristics.

MODE FOR CARRYING OUT THE INVENTION

Hereinafter, specific embodiments of the present technology will be described in detail with reference to the drawings.

Figure 1:
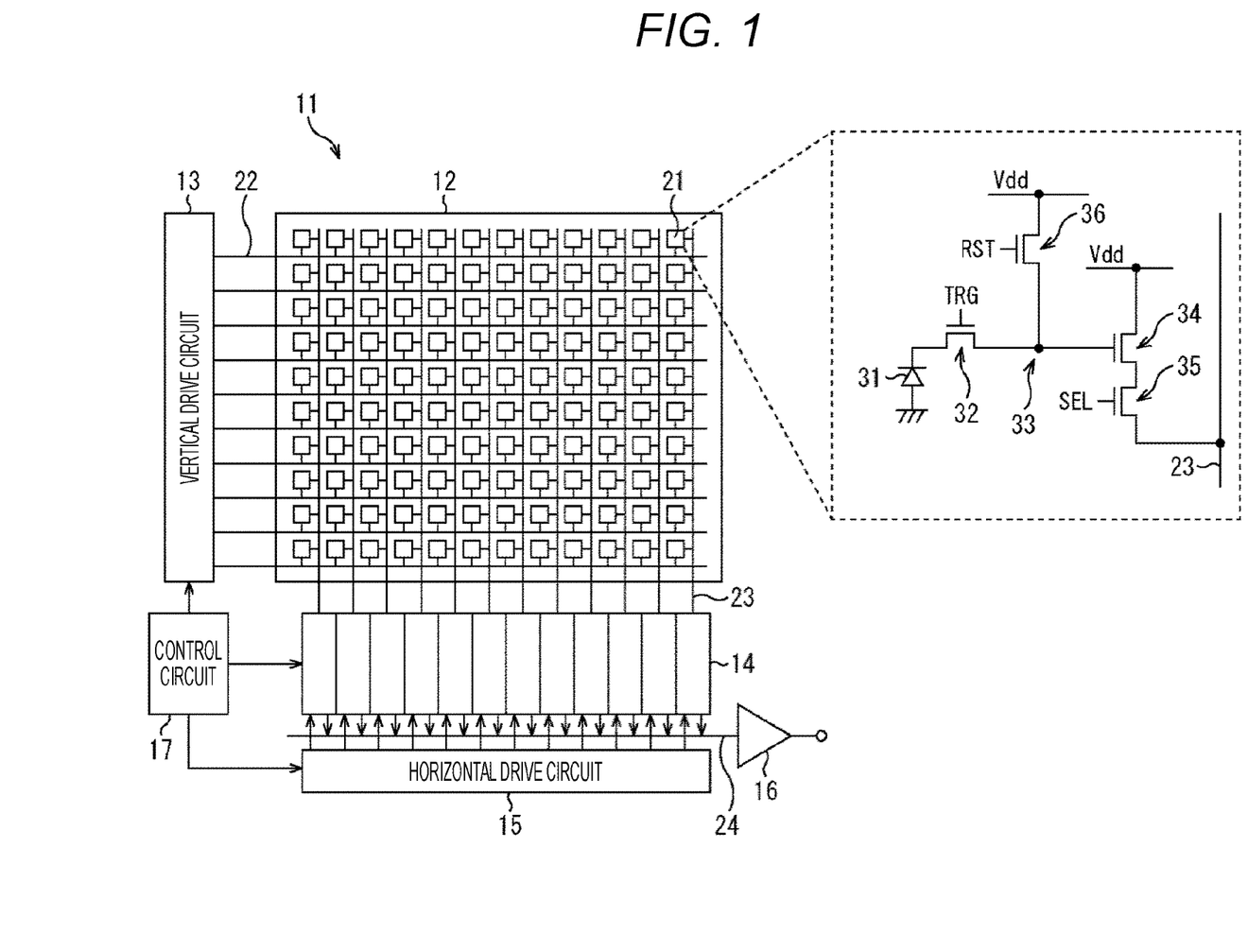
FIG. 1 is a block diagram illustrating a configuration example of an imaging element according to an embodiment of the present technology.

FIG. 1 is a block diagram illustrating a configuration example of an imaging element according to an embodiment of the present technology.

As illustrated in FIG. 1, an imaging element 11 includes a pixel region 12, a vertical drive circuit 13, a column signal processing circuit 14, a horizontal drive circuit 15, an output circuit 16, and a control circuit 17.

The pixel region 12 is a light receiving surface that receives light collected by an optical system (not illustrated). The pixel region 12 includes a plurality of pixels 21 arranged in a matrix. Each of the pixels 21 is connected to the vertical drive circuit 13 row by row via a horizontal signal line 22, while being connected to the column signal processing circuit 14 column by column via a vertical signal line 23. Each of the plurality of pixels 21 outputs a pixel signal having a level corresponding to the light amount of light to be received individually, and an image of a subject to be formed in the pixel region 12 is constructed from the pixel signals.

The vertical drive circuit 13 sequentially supplies drive signals to drive (transfer, select, reset, or the like) each of the pixels 21, row by row of the plurality of pixels 21 arranged in the pixel region 12, to the pixel 21 via the horizontal signal line 22. The column signal processing circuit 14 performs correlated double sampling (CDS) processing on the pixel signal output from the plurality of pixels 21 via the vertical signal line 23 so as to perform AD conversion of the pixel signal and remove reset noise.

The horizontal drive circuit 15 sequentially supplies a drive signal for causing the column signal processing circuit 14 to output a pixel signal to a data output signal line 24 for each of the columns of the plurality of pixels 21 arranged in the pixel region 12 to the column signal processing circuit 14. The output circuit 16 amplifies the pixel signal supplied from the column signal processing circuit 14 via the data output signal line 24 at a timing corresponding to the drive signal of the horizontal drive circuit 15, and outputs the amplified pixel signal to a signal processing circuit of the subsequent stage. The control circuit 17 controls driving of each of blocks inside the imaging element 11. For example, the control circuit 17 generates a clock signal corresponding to the driving cycle of each of the blocks and supplies the clock signal to each of the blocks.

Furthermore, the pixel 21 includes a PD 31, a transfer transistor 32, a floating diffusion (FD) portion 33, an amplification transistor 34, a select transistor 35, and a reset transistor 36.

The PD 31 is a photoelectric conversion unit that converts incident light into an electric charge by photoelectric conversion and accumulates the electric charge, in which an anode terminal is grounded and a cathode terminal is connected to the transfer transistor 32. The transfer transistor 32 is driven in accordance with a transfer signal TRG supplied from the vertical drive circuit 13. When the transfer transistor 32 is turned on, electric charges accumulated in the PD 31 are transferred to the FD unit 33. The FD unit 33 is a floating diffusion region having a predetermined accumulated capacitance connected to the gate electrode of the amplification transistor 34, and temporarily accumulates the electric charges transferred from the PD 31.

The amplification transistor 34 outputs a pixel signal of a level (namely, potential of the FD unit 33) corresponding to the electric charge accumulated in the FD unit 33 to the vertical signal line 23 via the select transistor 35. In other words, with a configuration connecting the FD unit 33 to the gate electrode of the amplification transistor 34, the FD unit 33 and the amplification transistor 34 function as a conversion unit that amplifies the electric charge generated in the PD 31 and converts it into a pixel signal of a level corresponding to the electric charge.

The select transistor 35 is driven in accordance with a select signal SEL supplied from the vertical drive circuit 13. When the select transistor 35 is turned on, the pixel signal output from the amplification transistor 34 turns to a state of being ready to be output to the vertical signal line 23. The reset transistor 36 is driven in accordance with a reset signal RST supplied from the vertical drive circuit 13. When the reset transistor 36 is turned on, the electric charge accumulated in the FD unit 33 is discharged to a drain power supply Vdd, and the FD unit 33 is reset.

Figure 2:
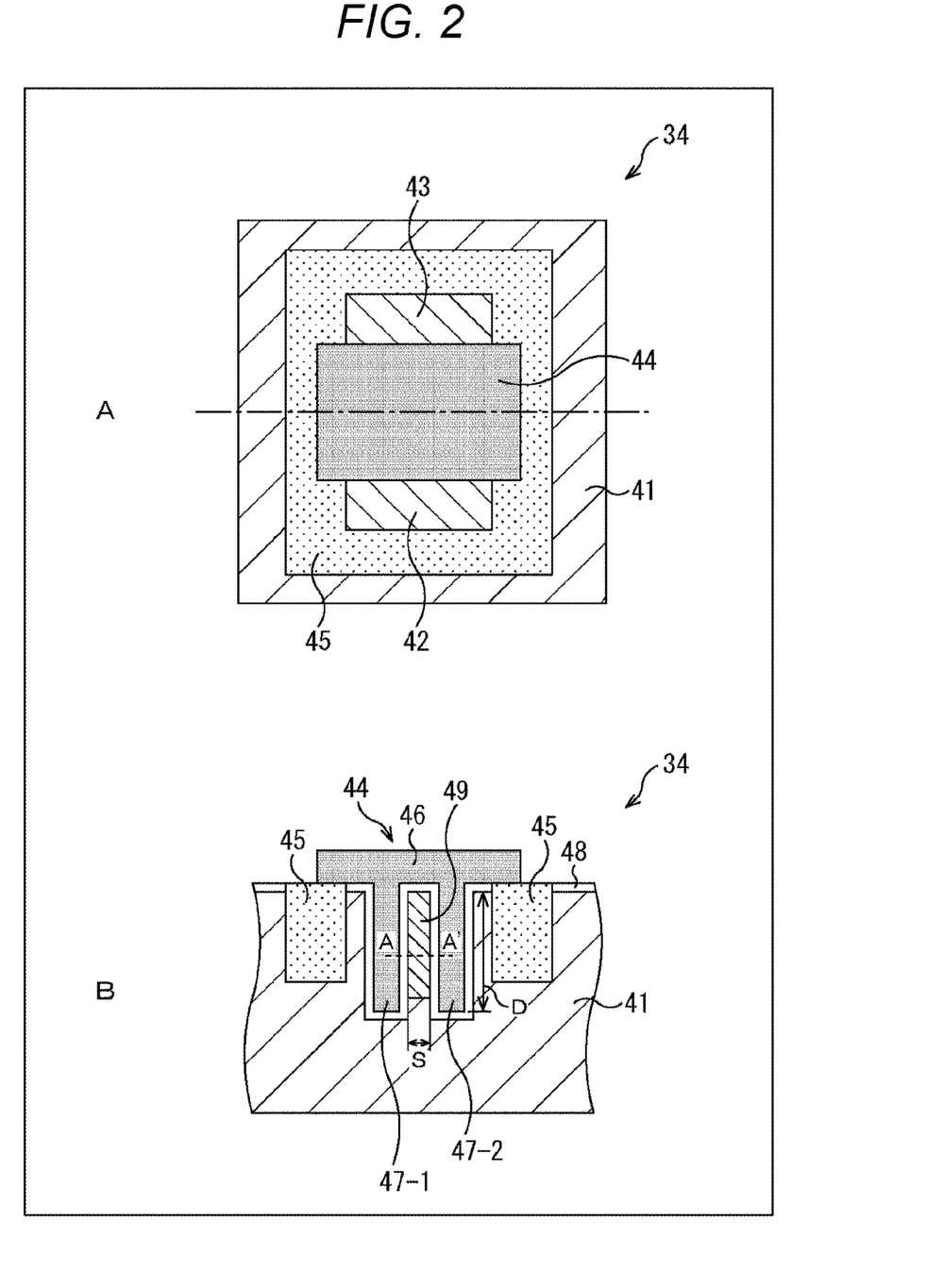
FIG. 2 is a diagram illustrating a configuration example of an amplification transistor.

FIG. 2 is a diagram illustrating a configuration example of the amplification transistor 34. A of FIG. 2 illustrates a planar configuration example of the amplification transistor 34, and B of FIG. 2 illustrates a cross-sectional configuration example of the amplification transistor 34 along a one-dot chain line illustrated in A of FIG. 2.

As illustrated in A of FIG. 2, the amplification transistor 34 has a configuration in which a gate electrode 44 is arranged between an N-type source 42 and a drain 43 provided in a P-type semiconductor substrate (Pwell) 41. Furthermore, an insulator such as an oxide film (SiO2) is buried in a groove formed so as to surround a periphery of the amplification transistor 34 to provide shallow trench isolation (STI) 45 for isolating the amplification transistor 34 from the outside.

Furthermore, as illustrated in B of FIG. 2, the gate electrode 44 is formed to include: a planar portion 46 planarly formed on a surface of the semiconductor substrate 41; and two fin portions 47-1 and 47-2 formed to be buried from the planar portion 46 toward an inside of the semiconductor substrate 41. In other words, the gate electrode 44 has a configuration in which the two fin portions 47-1 and 47-2 are formed at a portion corresponding to a channel of a normal transistor. Each of the fin portions 47-1 and 47-2 has a cross-sectional shape as illustrated in B of FIG. 2 and is formed from the source 42 toward the drain 43. Furthermore, the gate electrode 44 includes material such as a metal having a work function larger than that of an N-type semiconductor, or of a P-type semiconductor, for example.

Furthermore, an insulating film 48 is formed to ensure insulation between the gate electrode 44 and the semiconductor substrate 41.

In addition, a region on a semiconductor substrate 41, sandwiched between the fin portions 47-1 and 47-2 of the gate electrode 44 includes an N-type channel portion 49 formed across the source and the drain, so as to be in contact with side surfaces of the fin portions 47-1 and 47-2 via the insulating film 48. For example, the region where the N-type channel portion 49 is formed, that is, a region sandwiched between the two fin portions 47-1 and 47-2 has a width S set to be narrower than a depth D of the fin portions 47-1 and 47-2. For example, using a configuration having a large width S of this region would lower the modulation depth due to a back bias effect from the P-type semiconductor substrate 41. Accordingly, the channel portion 49 is formed to have the width S and the depth D that would not lower the modulation depth. Furthermore, the channel portion 49 is sandwiched between the fin portions 47-1 and 47-2 so as to allow a bottom surface side alone of the channel portion 49 to be in contact with the semiconductor substrate 41 (well), making it possible to suppress the back bias effect.

Furthermore, the channel portion 49 is formed with N-type having concentration sufficiently lower than in the source 42 or the drain 43. This allow the voltage at a region between the fin portions 47-1, 47-2 and the shallow trench isolation 45 to be lower than the voltage of the channel portion 49, so as not to contribute to source follower operation of the amplifier. For example, since the region between the fin portions 47-1 and 47-2 and the shallow trench isolation 45 is depleted with N-type or P-type in low concentration, making it possible to suppress the degree of influence as the gate capacitance of that region.

Figure 3:
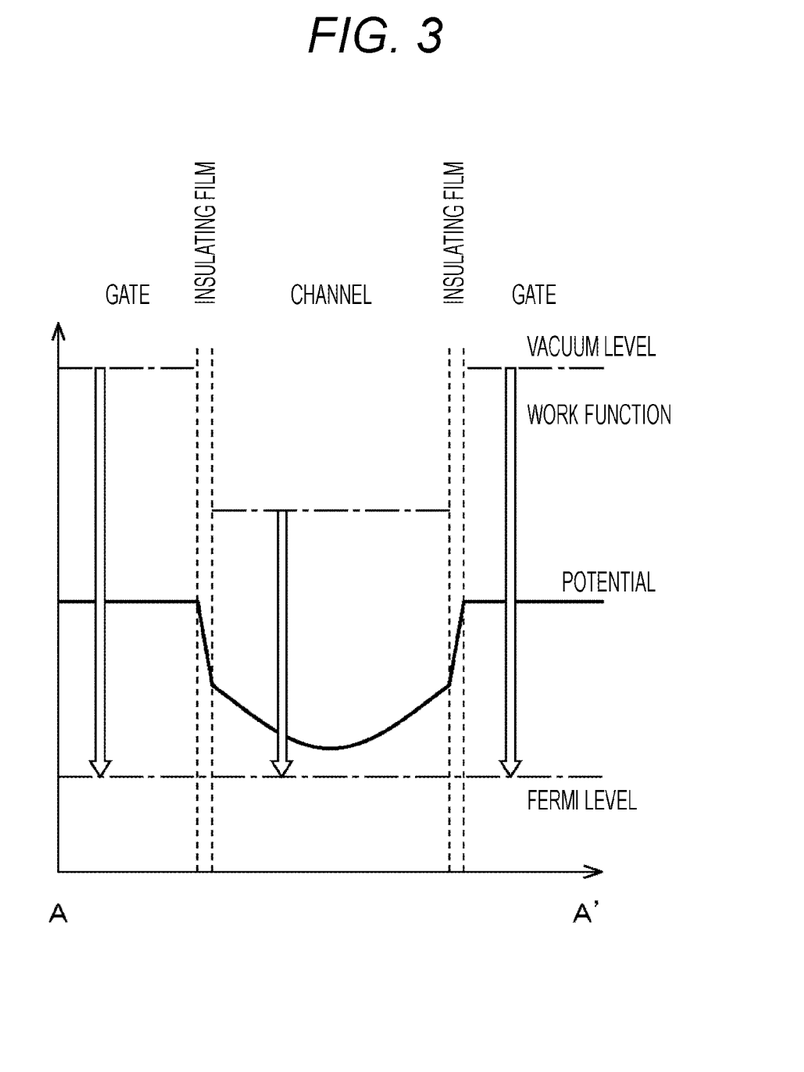
FIG. 3 is a diagram illustrating potential.

FIG. 3 is a diagram illustrating potential (Vg=Vd) at A-A' indicated by a broken line in B of FIG. 2.

As illustrated in FIG. 3, the amplification transistor 34 can satisfy the requirement as an amplifier characteristic while increasing the modulation depth. Since it is possible to increase the modulation depth in this manner, the amplification transistor 34 can increase signal amplitude and reduce the influence of noise in a subsequent circuit, for example.

Next, a modification of the amplification transistor 34 will be described with reference to FIG. 4. A of FIG. 4 illustrates a first modification of the amplification transistor 34, and B of FIG. 4 illustrates a second modification of the amplification transistor 34.

Figure 4:
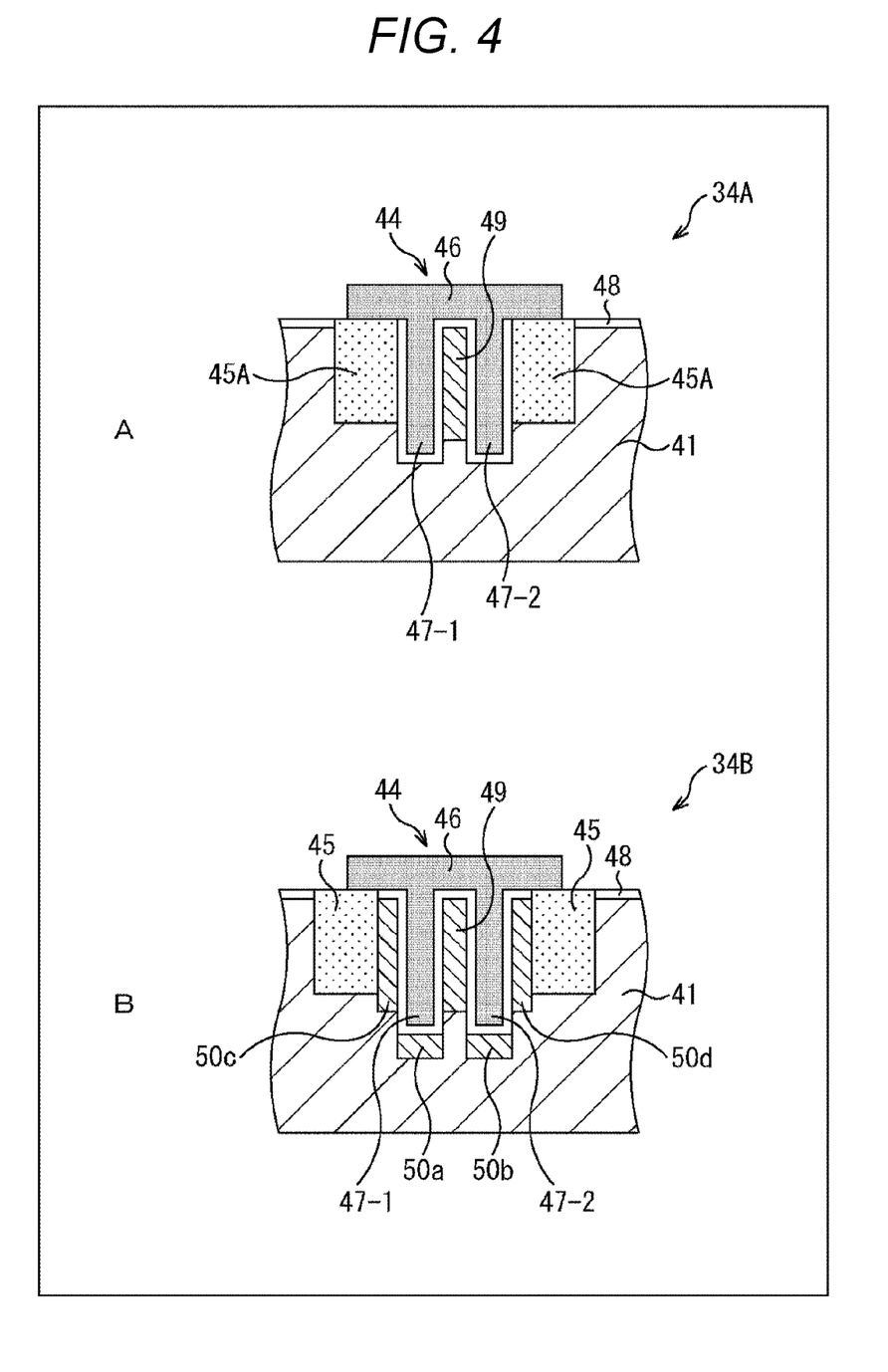
FIG. 4 is a diagram illustrating a first modification and a second modification of the amplification transistor.

Note that, in the amplification transistors 34A and 34B illustrated in FIG. 4, components common to the amplification transistor 34 of FIG. 2 are denoted by the same reference numerals, and a detailed description thereof will be omitted. That is, each of the amplification transistors 34A and 34B illustrated in FIG. 4 is configured in a manner similar to the amplification transistor 34 in FIG. 2 in that the channel portion 49 is provided between the two fin portions 47-1 and 47-2 of the gate electrode 44.

As illustrated in A of FIG. 4, the amplification transistor 34A has a configuration different from the configuration of the amplification transistor 34 in FIG. 2, in that, it has a shallow trench isolation 45A formed so as to be in contact with oppositely facing outer side surfaces of the two fin portions 47-1 and 47-2 via the insulating film 48. In other words, in contrast to the amplification transistor 34 of FIG. 2 in which a portion of the semiconductor substrate 41 is provided between each of the two fin portions 47-1 and 47-2 and the shallow trench isolation 45, the amplification transistor 34A has no such portion of the amplification transistor 34A provided in the structure.

As illustrated in B of FIG. 4, the amplification transistor 34B differs from the amplification transistor 34 in FIG. 2 in configuration in that the low concentration regions 50a and 50b are provided in the semiconductor substrate 41 on the tip side of the two fin portions 47-1 and 47-2. Furthermore, the amplification transistor 34B includes a low concentration region 50c provided between the fin portion 47-1 and the shallow trench isolation 45, and a low concentration region 50d provided between the fin portion 47-2 and the shallow trench isolation 45.

The low concentration regions 50a to 50d are regions having lower impurity concentration of N-type than in the channel portion 49, or regions having lower impurity concentration of P-type than in the semiconductor substrate 41. For example, an N-type impurity is implanted vertically downward with a trench for forming the fin portions 47-1 and 47-2 formed in the semiconductor substrate 41, enabling formation of the low concentration regions 50a to 50d.

With the low concentration regions 50a and 50b provided in this manner, it is possible to reduce the capacitance between the tips of the fin portions 47-1 and 47-2 of the gate electrode 44 and the semiconductor substrate 41. Furthermore, also with the low concentration regions 50c and 50d, it is possible to reduce the capacitance in a similar manner.

The amplification transistor 34 (including the modification) with this structure has a characteristic that the modulation depth of the channel becomes high. Therefore, it is also useful to apply the structure of the amplification transistor 34 to other transistors, for example, the reset transistor 36, the select transistor 35 or the like constituting the pixel 21.

Figure 5:
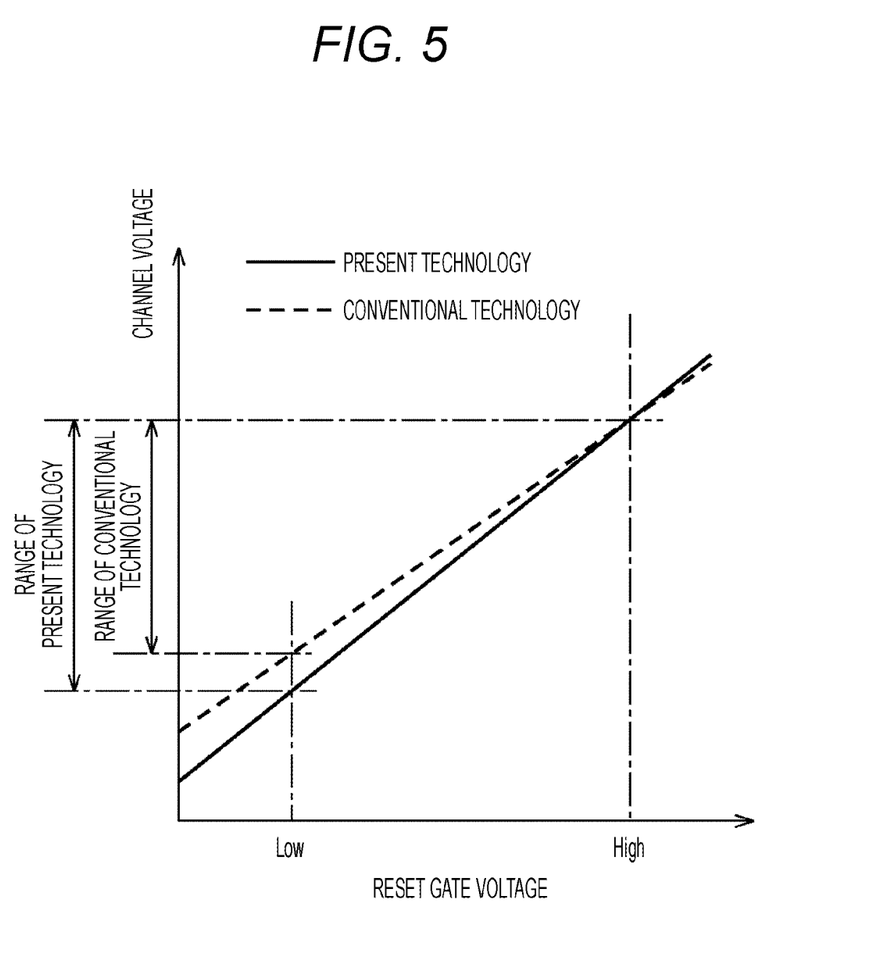
FIG. 5 is a diagram illustrating a voltage range within a usable range of an FD unit.

For example, the gate electrode 44 including the fin portions 47-1 and 47-2 of FIG. 2 can be applied to the reset transistor 36 to enable expanding a range of usable voltage of the FD unit 33 as illustrated in FIG. 5.

In FIG. 5, the horizontal axis represents the gate voltage of the reset transistor 36, and the vertical axis represents the voltage of the channel portion 49. As illustrated in the drawing, the present technology applying the gate electrode 44 having a shape with the fin portions 47-1 and 47-2 to the reset transistor 36 allows wider voltage range available for the FD unit 33 than in a configuration (conventional technology) having a gate electrode in a planar shape. This is because a difference between potential immediately after reset and channel potential at the reset OFF is the available range for the FD unit 33.

Similarly, the gate electrode 44 including the fin portions 47-1 and 47-2 of FIG. 2 can be applied to the select transistor 35 to enable expanding an application range of an output voltage of the vertical signal line 23.

Here, it is necessary to set a channel depletion voltage at the time of gate ON to a level higher than the drain voltage in the reset transistor 36 and the select transistor 35, and thus, the N-type may be adopted as a gate material. Note that, similarly to the amplification transistor 34, materials with different work functions can be adjusted by enhancing the N-type concentration of the channel, allowing the use of this.

Next, referring to FIG. 6, a configuration example of applying a gate electrode including a fin portion to the transfer transistor 32 will be described.

Figure 6:
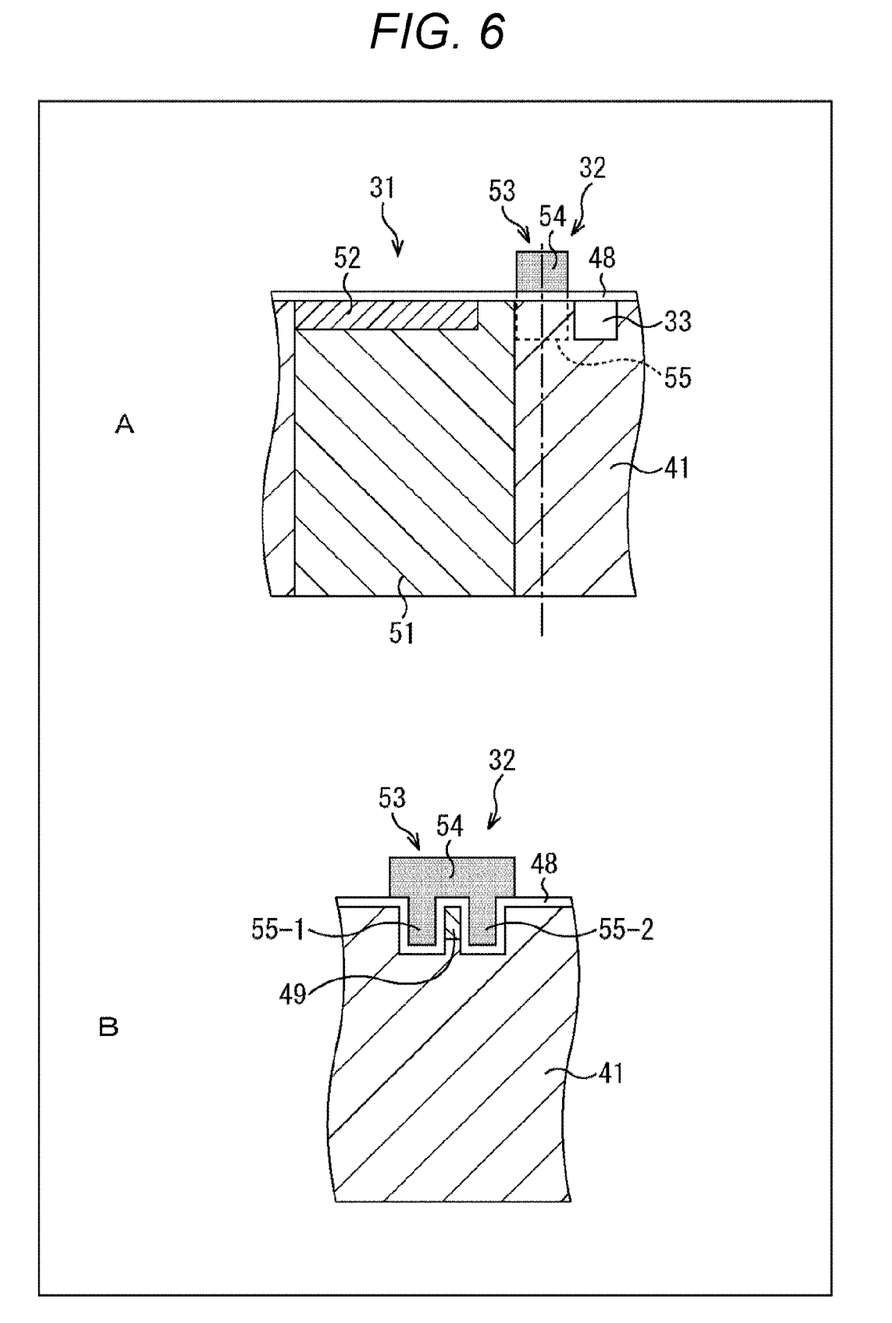
FIG. 6 is a diagram illustrating a configuration example of a transfer transistor.

A of FIG. 6 illustrates a cross-sectional configuration example of the transfer transistor 32 along an electric charge transfer path from the PD 31 to the FD unit 33. B of FIG. 6 illustrates a cross-sectional configuration example of the transfer transistor 32 illustrated in A of FIG. 6 along a one-dot chain line.

As illustrated in A of FIG. 6, the PD 31 is constituted by PN junction between an N-type region 51 formed down to a deep region of the semiconductor substrate 41 and a P-type region 52 formed on a surface of the N-type region 51. The FD unit 33 is arranged on a semiconductor substrate 41 which is on a same surface as the PD 31, at a position spaced apart from the PD 31 across the transfer transistor 32.

As illustrated in B of FIG. 6, a gate electrode 53 of the transfer transistor 32 is formed to include: a planar portion 54 planarly formed on a surface of the semiconductor substrate 41; and two fin portions 55-1 and 55-2 formed to be buried from the planar portion 54 toward an inside of the semiconductor substrate 41. The fin portions 55-1 and 55-2 are formed to have a depth equivalent to the depth of the FD unit 33, and the N-type channel portion 49 is formed in a region sandwiched between the fin portions 55-1 and 55-2.

Next, a modification of the transfer transistor 32 will be described with reference to FIG. 7. Note that, in transfer transistor 32A illustrated in FIG. 7, components common to the transfer transistor 32 of FIG. 6 are denoted by the same reference numerals, and a detailed description thereof will be omitted.

Figure 7:
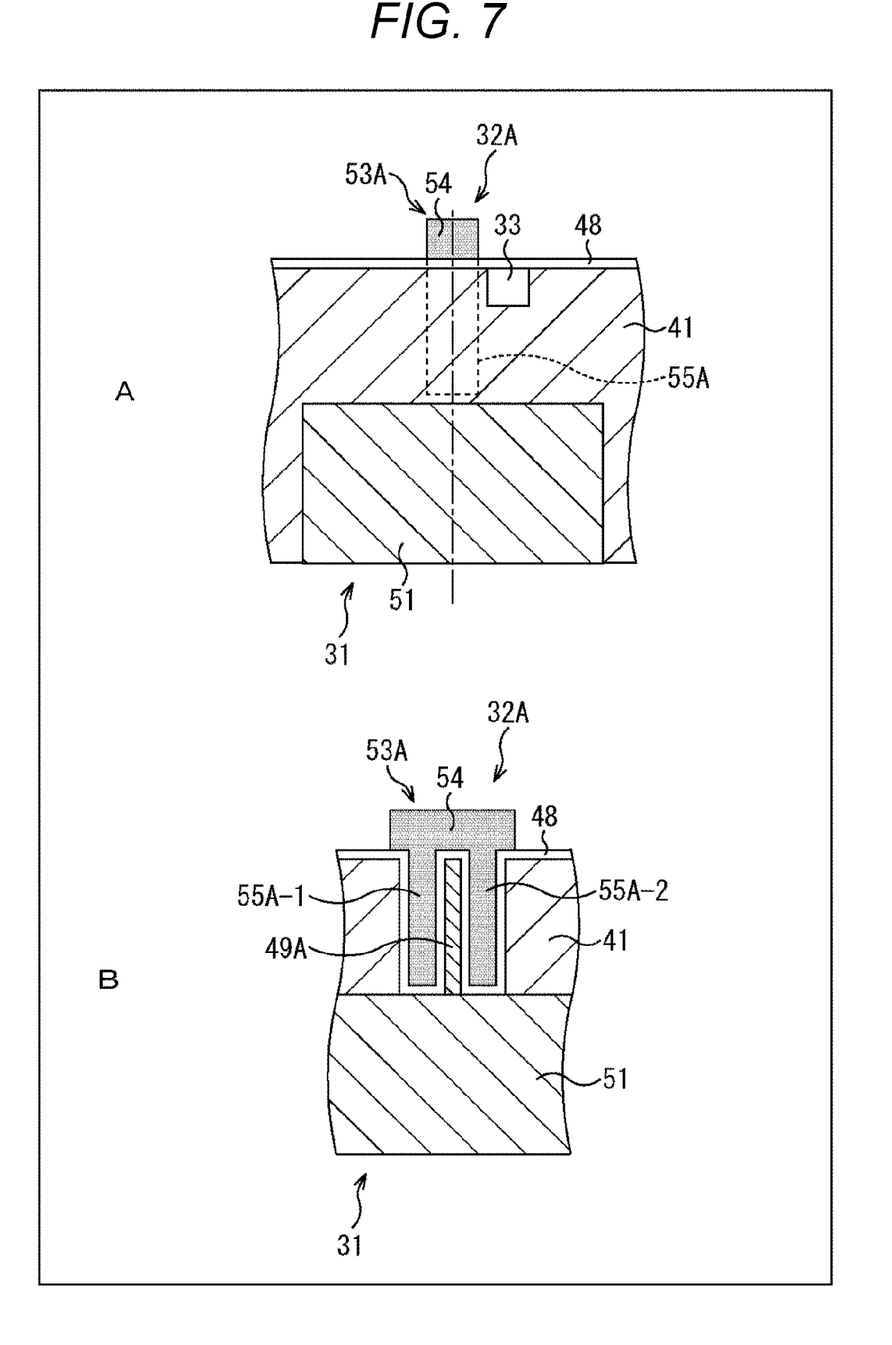
FIG. 7 is a diagram illustrating a modification of a transfer transistor.

As illustrated in A of FIG. 7, the PD 31 is formed at a deep position separate from the substrate surface of the semiconductor substrate 41, and the transfer transistor 32A is formed so as to read an electric charge from the PD 31 to the FD unit 33 formed on the substrate surface of the semiconductor substrate 41. For example, the gate electrode 53A of the transfer transistor 32A has a shape having two fin portions 55A-1 and 55A-2 formed so as to be buried from the planar portion 54 to a depth reaching the PD 31. In addition, as illustrated in B of FIG. 7, an N-type channel portion 49A is formed in a region sandwiched between the fin portions 55A-1 and 55A-2 down to the depth of the PD 31.

With the above-configured transfer transistors 32 and 32A respectively including the channel portions 49 and 49A in the region sandwiched between the fin portions 55-1 and 55-2, it is possible to achieve better transfer characteristics.

Meanwhile, even with the transistor having a configuration including two fin portions capable of achieving a high modulation depth as described above, there is an increasing demand for reduced transistor area with miniaturization of pixel size. Accordingly, with a transistor having one fin portion, it is possible to manage miniaturization of the pixel size.

Next, a modification of the amplification transistor 34 will be described with reference to FIG. 8. A of FIG. 8 illustrates a third modification of the amplification transistor 34, and B of FIG. 8 illustrates a fourth modification of the amplification transistor 34.

Figure 8:
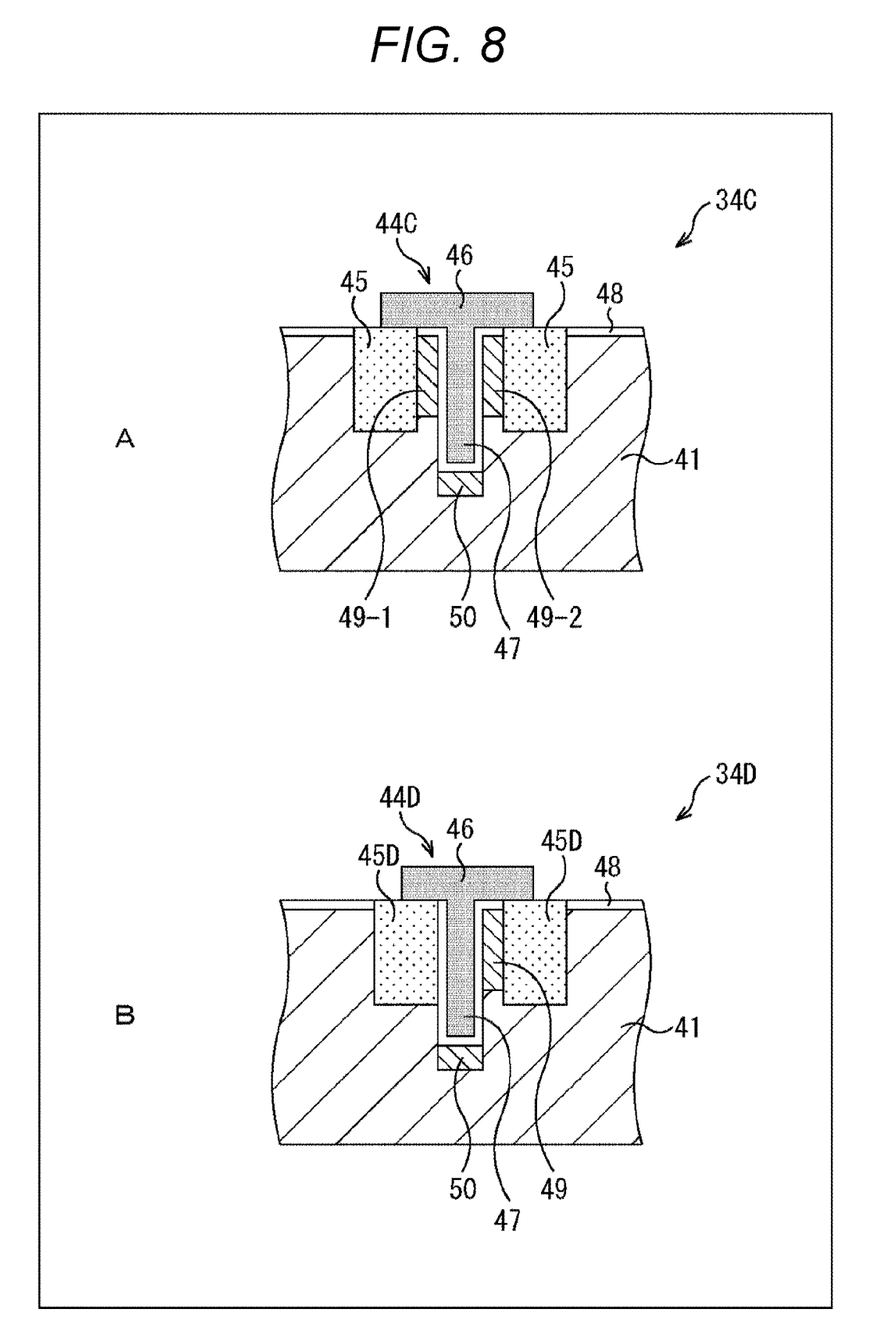
FIG. 8 is a diagram illustrating a third modification and a fourth modification of the amplification transistor.

As illustrated in A of FIG. 8, a gate electrode 44C of an amplification transistor 34C is formed to include one fin portion 47 formed to be buried from a planar portion 46 planarly formed on a surface of the semiconductor substrate 41 toward an inside of the semiconductor substrate 41. In addition, a channel portion 49-1 is provided between one side surface of the fin portion 47 and the shallow trench isolation 45, while a channel portion 49-2 is provided between the other side surface of the fin portion 47 and the shallow trench isolation 45. Furthermore, it is possible to provide a low concentration region 50 at the tip of the fin portion 47.

Furthermore, as illustrated in B of FIG. 8, a gate electrode 44D of an amplification transistor 34D is formed to include one fin portion 47 formed to be buried from the planar portion 46 planarly formed on a surface of the semiconductor substrate 41 toward an inside of the semiconductor substrate 41. In addition, the amplification transistor 34D includes a shallow trench isolation 45D formed so as to be in contact with one side surface of the fin portion 47 via the insulating film 48, and includes the channel portion 49 provided between the other side surface of the fin portion 47 and the shallow trench isolation 45D. Furthermore, it is possible to provide a low concentration region 50 at the tip of the fin portion 47.

As described above, even with a configuration of the amplification transistors 34C and 34D having a single fin portion 47, the channel portion 49 is provided in combination with the shallow trench isolation 45, making it possible to achieve a structure like a Silicon-on-Insulator (SOI). Even in such a configuration, with a P-type gate and an N-type channel, it is still possible to increase the modulation depth as compared with the configuration with a planar gate electrode, although not as significant as the case of the amplification transistor 34 in FIG. 2, and possible to satisfy the requirement of the amplifier characteristic.

As described above, the source follower amplifier achieving a higher modulation depth enables the imaging element 11 to improve S/N ratio including subsequent stage circuits, for example.

For example, the present technology can be applied to the amplification transistor 34 to achieve the channel portion 49 in the form of a buried channel, so that noise improvement of the amplification transistor 34 can be expected. Moreover, the present technology can be applied to the reset transistor 36, the select transistor 35, and the transfer transistor 32 to achieve expansion of the voltage range of the pixel output, leading to enhancement of the dynamic range.

Note that the present technology can be applied only to the pixel region 12 of the imaging element 11, and it is possible to form a transistor similar to the conventional one in peripheral circuits such as the vertical drive circuit 13 and the horizontal drive circuit 15, for example. Furthermore, while the above description assumes that the carriers are electrons, similar configuration can be achieved even in a case where the carriers are holes, that is, with an opposite type semiconductor. In this case, the gate of the amplifier transistor is a material having a smaller work function than the source/drain.

In addition, in addition to the imaging element 11 such as a CMOS image sensor, the present technology is also applicable to a sensor apparatus that includes a plurality of sensor portions arranged in an array, and that is driven by current-amplified voltage signal outputs of the sensor portions, in place of the pixel 21 that receives light, for example. Even in such a sensor apparatus, with an amplification configuration similar to the amplification transistor 34, it is still possible to improve characteristics similarly to the imaging element 11, and better characteristics can be achieved.

Note that the imaging element 11 as described above can be applied, for example, to various electronic devices including imaging systems such as a digital still camera and a digital video camera, a mobile phone having an imaging function, or other instrument having an imaging function.

Figure 9:
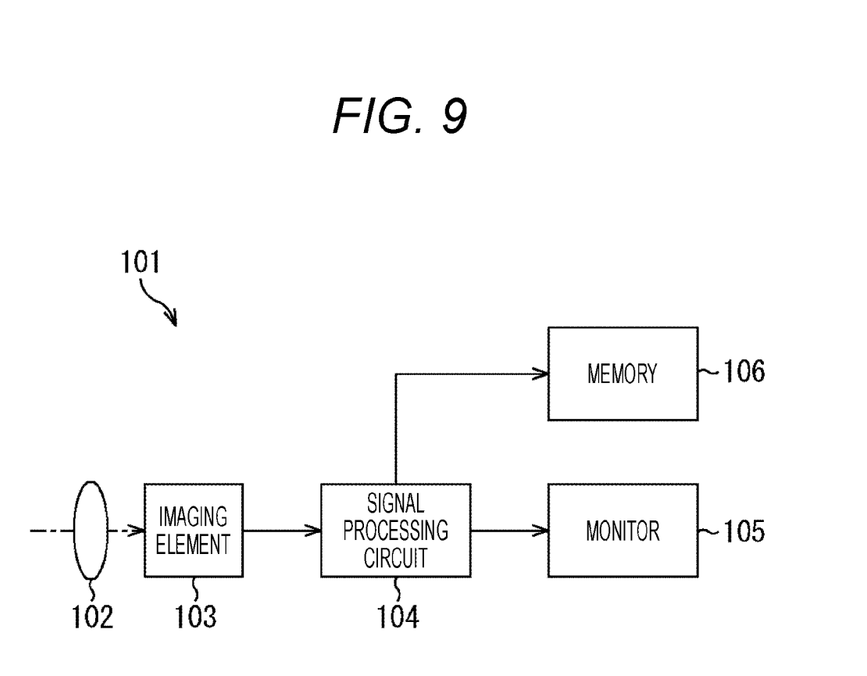
FIG. 9 is a block diagram illustrating a configuration example of an imaging apparatus according to an embodiment of the present technology.

FIG. 9 is a block diagram illustrating a configuration example of an imaging apparatus mounted on an electronic device.

As illustrated in FIG. 9, an imaging apparatus 101 includes an optical system 102, an imaging element 103, a signal processing circuit 104, a monitor 105, and a memory 106, and is capable of capturing a still image and a moving image.

The optical system 102 includes one or more lenses, introduces image light (incident light) from a subject to the imaging element 103, and forms an image on a light receiving surface (sensor portion) of the imaging element 103.

As the imaging element 103, the imaging element 11 described above is applied. The imaging element 103 accumulates electrons for a fixed period of time in accordance with an image formed on the light receiving surface via the optical system 102. Subsequently, a signal generated in accordance with the electrons accumulated in the imaging element 103 is supplied to the signal processing circuit 104.

The signal processing circuit 104 performs various types of signal processing on a pixel signal output from the imaging element 103. The image (image data) obtained by the signal processing performed by the signal processing circuit 104 is supplied to and displayed on the monitor 105, or supplied to and stored (recorded) in the memory 106.

With application of the above-described imaging element 11 in the imaging apparatus 101 configured as described above, it is possible to capture an image with low noise and higher quality, for example.

Figure 10:
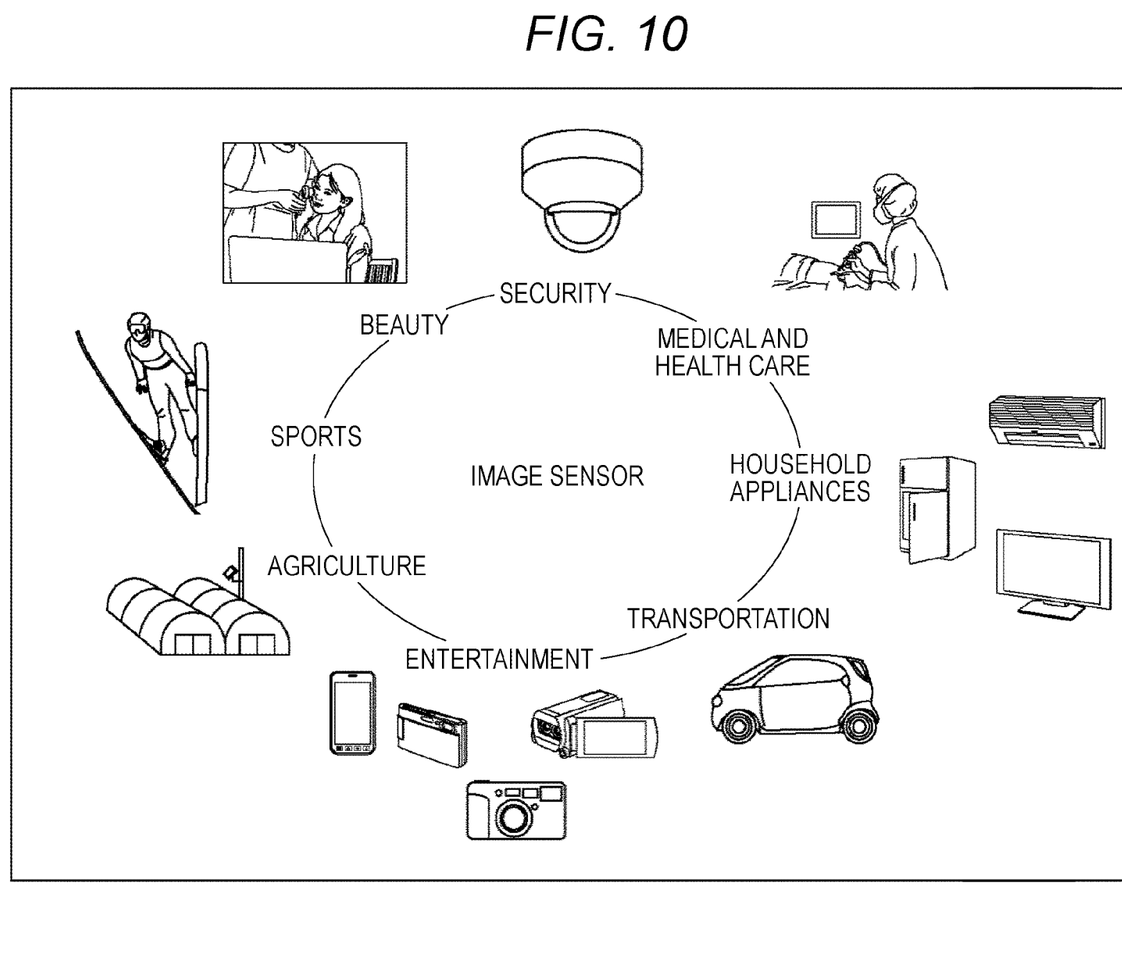
FIG. 10 is a diagram illustrating a usage example of using an image sensor.

FIG. 10 is a diagram illustrating a usage example using the above-described image sensor.

The above-described image sensor is applicable to various situations in which sensing is performed for light such as visual light, infrared light, ultraviolet light, and X-ray.

- A device for capturing an image for entertainment, such as a digital camera and a mobile device with a camera function.
- A device for transportation, such as an on-vehicle sensor that photographs a front, back, surroundings, interior, or the like, of a vehicle in order to ensure safe driving such as automatic stop, and to recognize driver's conditions, for example, a monitor camera to monitor driving vehicles and roads, and a range-finding sensor to perform measurement of a distance between vehicles, or the like.
- A device for household appliances including a TV, a refrigerator, an air conditioner, and the like to photograph user's gesture and perform operation of the apparatus according to the gesture.
- A device for medical and health care fields, such as an endoscope, and a device for angiography using reception of infrared light.
- A device for security, such as a monitor camera for crime prevention, and a camera for personal authentication.
- A device for beauty, such as a skin measuring instrument to photograph the skin, and a microscope to photograph the scalp.
- A device for sports, such as an action camera and a wearable camera for sports applications or the like.
- A device for agriculture, such as a camera to monitor conditions of fields and crops.

Note that the present technology can also be configured as follows.

(1)

A solid-state imaging element including a pixel having a transistor including:

a gate electrode having at least one fin portion formed so as to be buried from a planar portion planarly formed on a surface of a semiconductor substrate toward an inside of the semiconductor substrate; and a channel portion provided across a source and a drain so as to be in contact with a side surface of the fin portion via an insulating film, the transistor being formed to have a width of the channel portion narrower than a depth of the fin portion.

(2)

The solid-state imaging element according to (1), in which the gate electrode includes at least two fin portions, and the channel portion is formed in a region sandwiched between the fin portions.

(3)

The solid-state imaging element according to (2), in which the channel portion is formed to allow both side surfaces to be in contact with the fin portion via the insulating film and allow a bottom surface side alone to be in contact with the semiconductor substrate.

(4)

The solid-state imaging element according to any of (1) to (3), further including a shallow trench isolation provided to surround the transistor and isolating the transistor from an outside.

(5)

The solid-state imaging element according to (4), in which the shallow trench isolation is formed to be in contact with an outer side surface of the fin portion.

(6)

The solid-state imaging element according to (4) or (5), in which a low concentration region having impurity concentration lower than in the channel portion is provided in the semiconductor substrate between the shallow trench isolation and the outer side surface of the fin portion.

(7)

The solid-state imaging element according to any of (4) to (6), in which the gate electrode includes one fin portion, and the channel portion is provided between the fin portion and a shallow trench isolation provided to surround the transistor and isolating the transistor from an outside.

(8)

The solid-state imaging element according to any of (1) to (7), in which a low concentration region having lower impurity concentration than in the channel portion is provided in the semiconductor substrate on a tip side of the fin portion.

(9)

The solid-state imaging element according to any of (1) to (8), in which the transistor is an amplification transistor that amplifies an electric charge generated in a photoelectric conversion unit of the pixel and outputs the electric charge as a pixel signal.

(10)

The solid-state imaging element according to any of (1) to (8), in which the transistor is a reset transistor that resets an electric charge in a floating diffusion region that temporarily accumulates an electric charge generated in the photoelectric conversion unit of the pixel.

(11)

The solid-state imaging element according to any of (1) to (8), in which the transistor is a select transistor that connects the pixel and a signal line that outputs a pixel signal from the pixel.

(12)

The solid-state imaging element according to any of (1) to (8), in which the transistor is a transfer transistor that transfers an electric charge generated in a photoelectric conversion unit of the pixel.

(13)

The solid-state imaging element according to (12), in which the fin portion of the transfer transistor is formed to a depth reaching the photoelectric conversion unit formed at a deep position separate away from a substrate surface of the semiconductor substrate.

(14)

A sensor apparatus including a sensor portion having a transistor including:

a gate electrode having at least one fin portion formed so as to be buried from a planar portion planarly formed on a surface of a semiconductor substrate toward an inside of the semiconductor substrate; and a channel portion provided across a source and a drain so as to be in contact with a side surface of the fin portion via an insulating film, the transistor being formed to have a width of the channel portion narrower than a depth of the fin portion.

(15)

An electronic device including a solid-state imaging element having a pixel having a transistor including:

a gate electrode having at least one fin portion formed so as to be buried from a planar portion planarly formed on a surface of a semiconductor substrate toward an inside of the semiconductor substrate; and a channel portion provided across a source and a drain so as to be in contact with a side surface of the fin portion via an insulating film, the transistor being formed to have a width of the channel portion narrower than a depth of the fin portion.

Note that the present embodiments are not limited to the above-described embodiments, and various modifications are possible within the scope not deviating from the scope and spirit of the present disclosure.

REFERENCE SIGNS LIST

11 Imaging element
12 Pixel region
13 Vertical drive circuit
14 Column signal processing circuit
15 Horizontal drive circuit
16 Output circuit
17 Control circuit
21 Pixel
31 PD
32 Transfer transistor
33 FD unit
34 Amplification transistor
35 Select transistor
36 Reset transistor
41 Semiconductor substrate
42 Source
43 Drain
44 Gate electrode
45 Shallow trench isolation
46 planar portion
47 Fin portion
48 Insulating film
49 Channel portion
50 Low concentration region
51 N-type region
52 P-type region
53 Gate electrode
54 planar portion
55 Fin portion

What is claimed is:

1. A solid-state imaging element including a pixel having a transistor comprising:

a gate electrode having at least one fin portion formed so as to be buried from a planar portion planarly formed on a surface of a semiconductor substrate toward an inside of the semiconductor substrate;

a channel portion provided across a source and a drain so as to be in contact with a side surface of the tin portion via an insulating film, wherein the transistor is formed to have a width of the channel portion narrower than a depth of the fin portion; and a shallow trench isolation provided to surround the transistor and isolating the transistor from an outside, and wherein a low concentration region having impurity concentration lower than in the channel portion is provided in the semiconductor substrate between the shallow trench isolation and the outer side surface of the fin portion.

2. The solid-state imaging element according to claim 1, wherein the shallow trench isolation is formed to be in contact with an outer side surface of the fin portion.

3. The solid-state imaging element according to claim 1, wherein the transistor is an amplification transistor that amplifies an electric charge generated in a photoelectric conversion unit of the pixel and outputs the electric charge as a pixel signal.

4. The solid-state imaging element according to claim 1, wherein the transistor is a reset transistor that resets an electric charge in a floating diffusion region that temporarily accumulates an electric charge generated in the photoelectric conversion unit of the pixel.

5. The solid-state imaging element according to claim 1, wherein the transistor is a select transistor that connects the pixel and a signal line that outputs a pixel signal from the pixel.

6. A solid-state imaging element including a pixel having a transistor comprising:

a gate electrode having one fin portion formed so as to be buried from a planar portion planarly formed on a surface of a semiconductor substrate toward an inside of the semiconductor substrate; and a channel portion provided across a source and a drain so as to be in contact with a side surface of the fin portion via an insulating film, wherein the transistor is formed to have a width of the channel portion narrower than a depth of the fin portion, and wherein the channel portion is provided between the fin portion and a shallow trench isolation provided to surround the transistor and isolating the transistor from an outside.

7. The solid-state imaging element according to claim 6, wherein the shallow trench isolation is formed to be in contact with an outer side surface of the fin portion.

8. The solid-state imaging element according to claim 6, wherein the transistor is an amplification transistor that amplifies an electric charge generated in a photoelectric conversion unit of the pixel and outputs the electric charge as a pixel signal.

9. The solid-state imaging element according to claim 6, wherein the transistor is a reset transistor that resets an electric charge in a floating diffusion region that temporarily accumulates an electric charge generated in the photoelectric conversion unit of the pixel.

10. The solid-state imaging element according to claim 6, wherein the transistor is a select transistor that connects the pixel and a signal line that outputs a pixel signal from the pixel.

11. A solid-state imaging element including a pixel having a transistor comprising:
- a gate electrode having at least one fin portion formed so as to be buried from a planar portion planarly formed on a surface of a semiconductor substrate toward an inside of the semiconductor substrate; and
- a channel portion provided across a source and a drain so as to be in contact with a side surface of the fin portion via an insulating film,
- wherein the transistor is formed to have a width of the channel portion narrower than a depth of the fin portion, and wherein a low concentration region having lower impurity concentration than in the channel portion is provided in the semiconductor substrate on a tip side of the fin portion.

12. The solid-state imaging element according to claim 11, wherein the gate electrode includes at least two fin portions, and the channel portion is formed in a region sandwiched between two of the fin portions.

13. The solid-state imaging element according to claim 12, wherein the channel portion is formed to allow both side surfaces to be in contact with the fin portion via the insulating film and allow a bottom surface side alone to be in contact with the semiconductor substrate.

14. The solid-state imaging element according to claim 11, further comprising
- a shallow trench isolation provided to surround the transistor and isolating the transistor from an outside.

15. The solid-state imaging element according to claim 14, wherein the shallow trench isolation is formed to be in contact with an outer side surface of the fin portion.

16. The solid-state imaging element according to claim 11, wherein the transistor is an amplification transistor that amplifies an electric charge generated in a photoelectric conversion unit of the pixel and outputs the electric charge as a pixel signal.

17. A solid-state imaging element including a pixel having a transistor comprising:
- a gate electrode having at least one fin portion formed so as to be buried from a planar portion planarly formed on a surface of a semiconductor substrate toward an inside of the semiconductor substrate; and
- a channel portion provided across a source and a drain so as to be in contact with a side surface of the fin portion via an insulating film,
- wherein the transistor is formed to have a width of the channel portion narrower than a depth of the fin portion, and wherein the transistor is a reset transistor that resets an electric charge in a floating diffusion region that temporarily accumulates an electric charge generated in the photoelectric conversion unit of the pixel.

18. A solid-state imaging element including a pixel having a transistor comprising:
- a gate electrode having at least one fin portion formed so as to be buried from a planar portion planarly formed on a surface of a semiconductor substrate toward an inside of the semiconductor substrate; and
- a channel portion provided across a source and a drain so as to be in contact with a side surface of the fin portion via an insulating film,
- wherein the transistor is formed to have a width of the channel portion narrower than a depth of the fin portion, and wherein the transistor is a select transistor that connects the pixel and a signal line that outputs a pixel signal from the pixel.

19. A solid-state imaging element including a pixel having a transistor comprising:
- a gate electrode having at least one fin portion formed so as to be buried from a planar portion planarly formed on a surface of a semiconductor substrate toward an inside of the semiconductor substrate; and
- a channel portion provided across a source and a drain so as to be in contact with a side surface of the fin portion via an insulating film,
- wherein the transistor is formed to have a width of the channel portion narrower than a depth of the fin portion, and
- wherein the transistor is a transfer transistor that transfers an electric charge generated in a photoelectric conversion unit of the pixel.

20. The solid-state imaging element according to claim 19, wherein the fin portion of the transfer transistor is formed to a depth reaching the photoelectric conversion unit formed at a deep position separate away from a substrate surface of the semiconductor substrate.

* * * * *